United States Patent [19]

Murray

[11] 4,041,516
[45] Aug. 9, 1977

[54] HIGH INTENSITY LIGHT-EMITTING DIODE

[75] Inventor: Roger W. Murray, Sunnyvale, Calif.

[73] Assignee: Litronix, Inc., Cupertino, Calif.

[21] Appl. No.: 599,734

[22] Filed: July 28, 1975

Related U.S. Application Data

[63] Continuation of Ser. No. 430,855, Jan. 4, 1974, abandoned.

[51] Int. Cl.$^2$ ............................................. H01L 33/00
[52] U.S. Cl. ...................................... 357/17; 357/20; 357/32
[58] Field of Search ..................... 357/17, 20, 32, 30

[56] References Cited

U.S. PATENT DOCUMENTS

| | | | |
|---|---|---|---|
| 3,308,452 | 3/1967 | Michel | 340/324 |
| 3,343,026 | 9/1967 | Leuchinger | 313/108 |
| 3,373,051 | 3/1968 | Chu | 117/106 |
| 3,436,282 | 4/1969 | Shoda | 148/187 |

Primary Examiner—Martin H. Edlow
Attorney, Agent, or Firm—Townsend and Townsend

[57] ABSTRACT

An LED array with improved radiation intensity and distribution characteristics. A plurality of P-type regions are formed in an N-type substrate by growing an adherent dielectric layer onto the substrate, exposing a plurality of diffusion sites by selectively etching the dielectric layer and diffusing a dopant into the substrate at the diffusion sites until adjacent P-regions are joined by the process of lateral diffusion. The diffusion rate is controlled so that the interconnecting P-regions are extremely thin. These regions exhibit low photon absorption without the usual adverse surface effects formed in thin layers. The surface dielectric has a dielectric constant matched to that of the underlying LED material to optimize radiation transmission across their mutual boundary. The P-regions are geometrically arranged to provide improved radiation distribution at angles near the normal to the surface.

6 Claims, 8 Drawing Figures

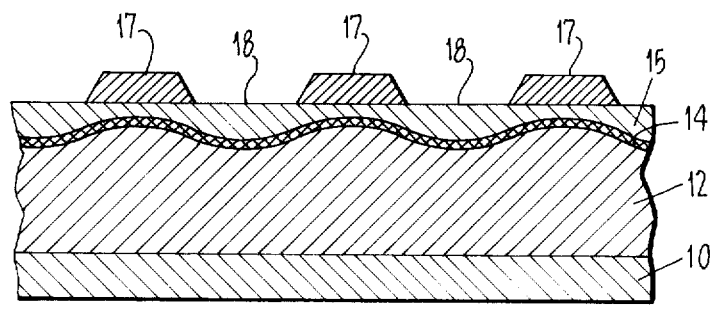
Fig_1
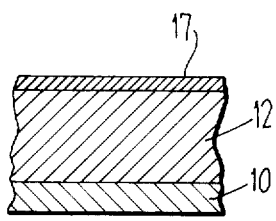
Fig_2A
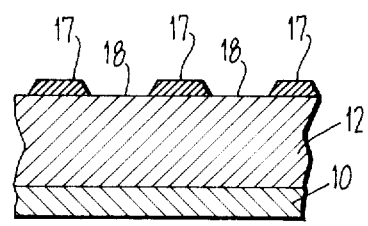
Fig_2B
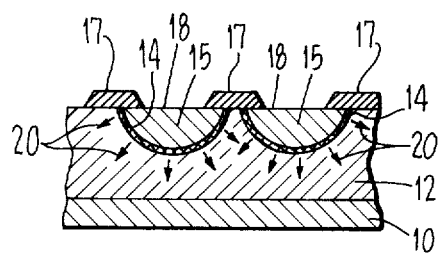
Fig_2C
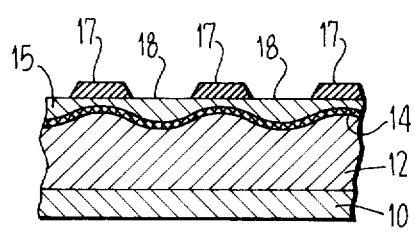
Fig_2D
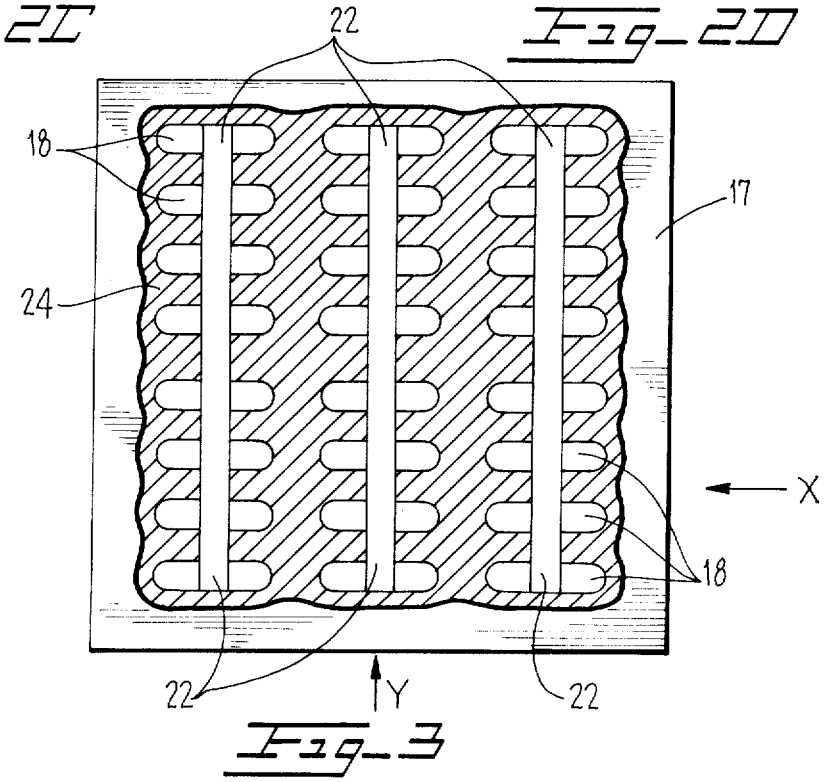
Fig_3

HIGH INTENSITY LIGHT-EMITTING DIODE

This is a continuation of application Ser. No. 430,855, filed Jan. 4, 1974, now abandoned.

BACKGROUND OF THE INVENTION

This invention relates to light-emitting diodes.

Light-emitting diodes are known in which a P-type region is formed in the upper surface of an N-type semiconductor base material. When a voltage is applied across the junction formed by the P-type and N-type materials, photons of radiation are emitted from the boundary, migrate to the surface and escape, the wavelength of the radiation depending on the nature of the P-type and N-type materials employed. For example, if zinc dopant is diffused into Ga As N-type base material to form a P-type region, radiation having a wavelength of about 9,000 A is emitted. Similarly, if an epitaxial layer of Ga-As P is formed on top of a base layer of Ga As and zinc is used as the dopant material, radiation having a wavelength of about 6.000 A is emitted. Since diodes of the latter type emit radiation having a wavelength lying in the visible (red) range of the spectrum, such diodes may be employed as indicating devices or the like.

A critical factor affecting the utility of such light-emitting diodes is the fraction of the emitted radiation which escapes from the material. Since the photons are emitted at the boundary lying predominantly within the surface of the material, they must travel through this material before reaching the viewing surface. In transit, many photons are absorbed in the P layer. These absorbed photons thus make no contribution to the total amount of viewable radiation.

Since the degree of self-absorption of the emitted photons by the material is largely dependent upon the thickness of the P layer, attempts have been made in the past to improve the intensity of the emitted light by reducing the thickness of the P layer to minimize absorption. Such efforts have not been particularly successful due to the fact that the non-radiative recombination of electrons within the P layer increases as the thickness of the P layer decreases. Thus, the emittive capability of the diode decreases as the thickness of the P layer decreases. In practice, it has been found that the minimum thickness of the P region required for successful operation of an LED is on the order of 3 microns. However, P regions with a minimum thickness of 3 microns still exhibit substantial self-absorption of the photons emitted at the boundary and the intensity of the viewable radiation suffers accordingly.

Another factor contributing to the limited intensity characteristics of light-emitting diodes is the radiation pattern exhibited by known light-emitting diodes. It has been found that this radiation pattern approximates a lambertian distribution in which a substantial portion of the radiation emitted from the surface emerges at an angle which is rather shallow with respect to the horizontal surface of the diode. Since the diode is ordinarily viewed at angles close to the normal to the surface, the lambertian distribution correspondingly reduces the component of the emitted radiation normal to the surface. This effect is ordinarily observed as a blurring of the outer edges of a specific character when a plurality of diodes are formed into an alphanumeric array. This undesirable effect has been partially overcome by the use of epoxy lenses which serve to focus a greater portion of the emitted radiation in the normal and near normal directions. Due to the relatively small dimensions of typical P regions, however, and the relatively large size of such lenses, a large proportion of the total emitted radiation is nevertheless lost for viewing purposes. Efforts to overcome the above-noted problems have not met with wide success.

SUMMARY OF THE INVENTION

The invention comprises a light-emitting diode which possesses substantially improved radiation intensity and distribution characteristics. In the preferred embodiment, a plurality of P-type regions are formed in an N-type substrate by growing an adherent dielectric layer onto the N-type base, etching a plurality of holes in the dielectric to expose the base surface at a plurality of sites, and diffusing a suitable dopant into the base at the diffusion sites until adjacent P regions are joined by the process of lateral diffusion. By controlling the diffusion temperature and time, extremely thin interconnecting P regions are formed underneath the dielectric layer. These intermediate P regions enjoy substantially reduced photon self-absorption characteristics without the usual deleterious surface effects. The surface dielectric preferably employed has a dielectric constant matched to that of the base material which further improves the transmission of radiation outwardly of the diode. The intermediate P regions are arranged as a plurality of generally mutually parallel regions which exhibit a pronounced radiation focusing effect along a direction generally normal to thier longitudinal axes.

For a further understanding of the nature and advantages of the invention, reference should be had to the following detailed description taken in conjunction with the accompanying drawings.

BRIEF DESCRIPTION OF THE DRAWINGS

FIG. 1 is a diagrammatic, sectional view of an array of semiconductor LED's fabricated according to the invention;

FIGS. 2A-2D illustrate the preferred method of fabrication of the device of FIG. 1;

FIG. 3 is a top plan view illustrating an LED array suitable for use as a fundamental unit for a display;

DESCRIPTION OF THE PREFERRED EMBODIMENTS

Figure 4:
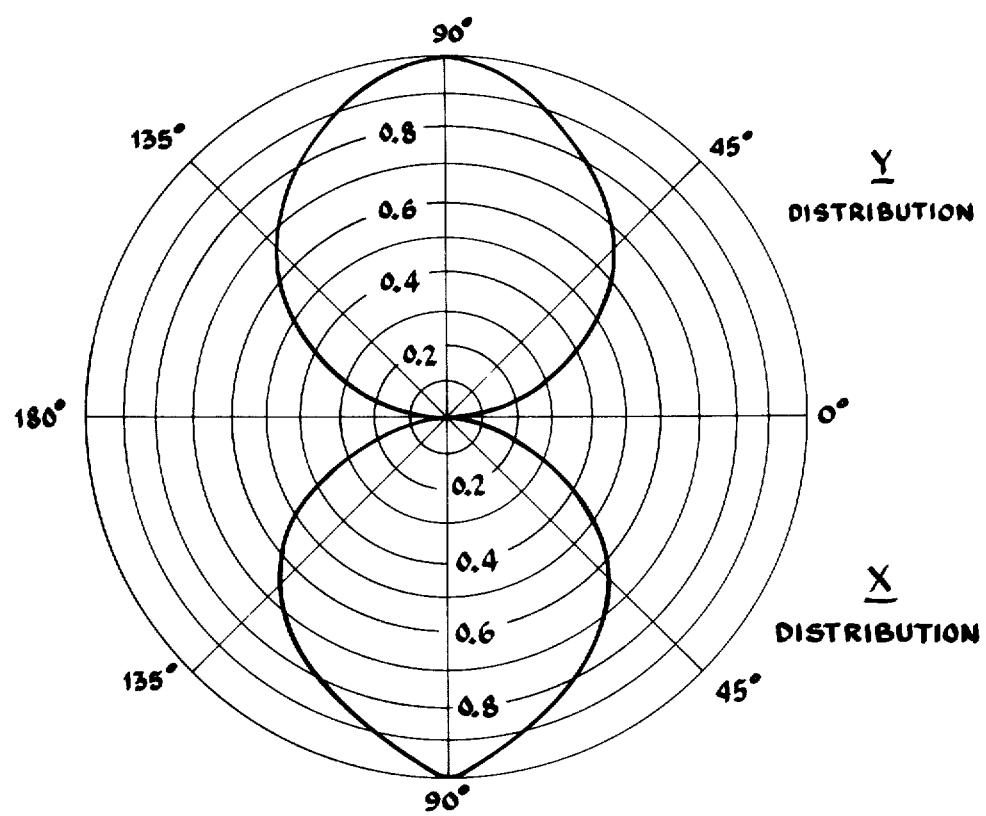
FIG. 4 is a radiation distribution plot taken along orthogonal directions of the FIG. 3 device.

Turning now to the drawings, FIG. 1 shows a diagrammatic, sectional view of a monolithic array of LED's constructed according to the invention. The monolithic array comprises a base layer 10 of a suitable N-type semiconductor material, such as a Ga As and an epitaxial layer 12 selected from a material in accordance with conventional criteria to enable the generation of radiation having a wavelength in the visible portion of the spectrum. In the preferred embodiment, layer 12 comprises Ga As P.

Joined to the upper surface of epitaxial layer 12 by a common boundary 14 is a layer of P-type material 15 formed in the manner described below in conjunction with FIGS. 2A-2D. Overlying P-type layer 15 is a dielectric material 17, preferably $Si_3N_4$, having interstitial voids 18 for the purpose of exposing the upper surface of P-type layer 15 for ohmic contact with a conductor (not shown). Dielectric material 17 preferably has a dielectric constant matched to that of the underlying semiconductor material to optimize radiation transmission across their common boundary.

With reference to FIGS. 2A-2D, fabrication of the monolithic array of LED's proceeds in the following manner. A conventional substrate comprising a lower layer of Ga As 10 and Ga As P 12 is provided with an upper layer of $Si_3N_4$ dielectric material 17 having a thickness of about 1,000 A. This upper dielectric layer is preferably grown on the surface of epitaxial layer 12 using conventional techniques at a temperature of about 705° C. (FIG. 2A). Interstitial voids 18 are next formed using conventional photoresist and etching techniques to produce the intermediate construction shown in FIG. 2B. After formation of voids 18, zinc dopant is diffused into epitaxial layer 12 via the diffusion sites provided by voids 18. The P regions 15 expand during the diffusion process in the manner generally indicated by arrows 20 in FIG. 2C. This expansion is permitted to continue until adjacent P regions 15 intersect to form a continuous P-type layer as shown in FIGS. 2D. As shown in this FIG., those portions of P-type layer 15 underlying dielectric 17 have a much shallower depth than the regions of layer 15 underlying voids 18. In the preferred embodiment, a P-type layer 15 having a minimum thickness of about 1.5 microns and a maximum thickness of about 3.0 microns was fabricated by diffusing zinc dopant into an epitaxial layer 12 for 30 minutes at a temperature of 800° C to provide optimum results. However, the diffusion temperature and time may be adjusted as desired to achieve the above-noted P-type layer configuration.

FIG. 3 shows a planar view of an array of LED's found suitable for use as the basic unit for constructing segments of a character display. As shown in this FIG., each LED array of the unit is provided with voids 18 in the shape of oblong openings which are generally mutually parallel. A metalization contact strip 22 provides an ohmic contact to the surface of P-type regions 15 exposed by voids 18. The shallow portions of the P-type layer 15 underlying dielectric 17 are indicated by the shading denoted by reference numeral 24 in this FIG. It is understood, however, that dielectric 17 physically overlies these regions of the thin P-type layer. In practice a plurality of the basic units shown in FIG. 3 are arranged to form a single segment of a particular alphanumeric character.

The spatial radiation distribution measured for the FIG. 3 unit is shown in FIG. 4. In FIG. 4, the intensity of emitted radiation is plotted as a function of angle to the surface at constant distance from the geometrical center of the unit. The upper lobe of the FIG. 4 plot shows the intensity distribution as measured in the Y direction indicated in FIG. 3 while the lower lobe shows the intensity distribution as measured in the X direction of FIG. 3. The curves are normalized so that the radiation measured with the detector directly over the geometrical center of the unit is arbitrarily assigned a value of 1.

Figure 5:
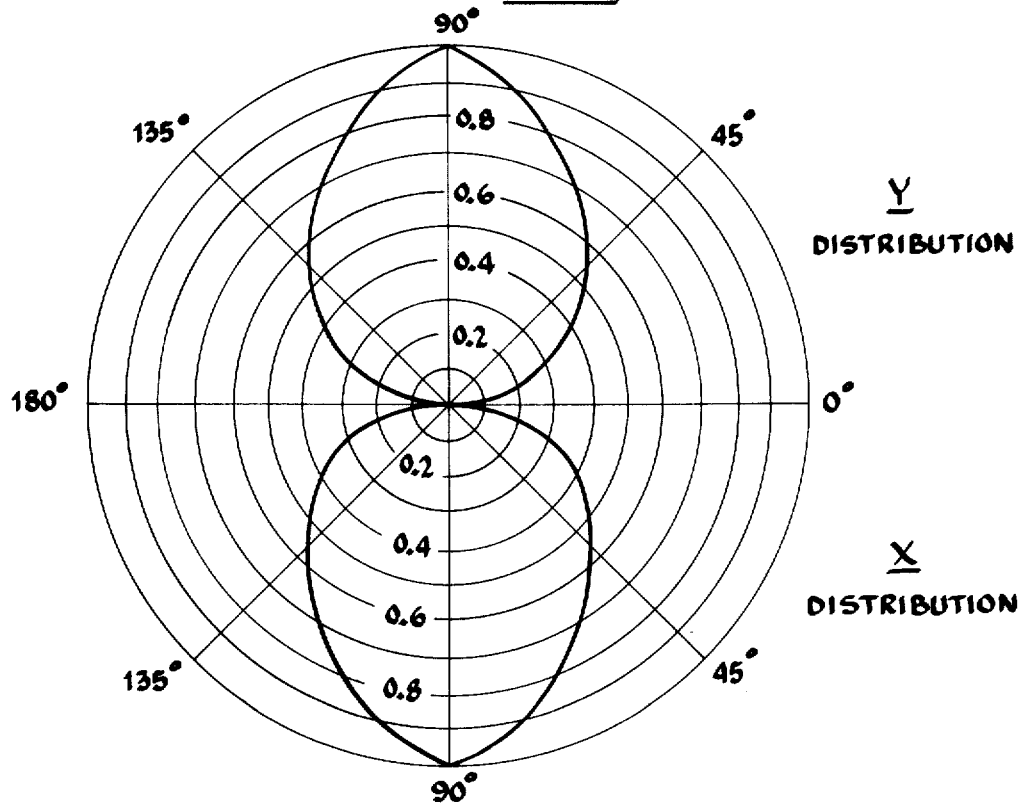
FIG. 5 is a similar plot taken along orthogonal directions of prior art device.

FIG. 5 shows a similar plot of the radiation distribution of an array of LED devices constructed according to conventional techniques. As a comparison of the two plots shows, the intensity of radiation emitted at shallow viewing angles is much less with the FIG. 3 unit than with state of the art devices. Further, the distriution of intensity about the normal to the geometric center of the unit is expanded over a wider angle with higher intensity than for the conventional device. The effect of the latter is to provide a broader viewing angle at higher intensities than with the conventional device.

While one specific embodiment of the invention has been particularly described, it is understood that the principles of the invention are applicable to numerous semiconductor elements and compounds with equally beneficial results. For example, N-type semiconductor material such as Gallium Aluminum Arsenide or Indium Aluminum Arsenide may be employed for base layer 10 and epitaxial layer 12. Likewise, other dopants such as cadmium may be employed for forming P-type layer 15. In addition, other dielectric materials such as Silicon dioxide or sputtered borosilicate glasses may be employed for dielectric layer 17.

While the foregoing provides a complete and adequate disclosure of the preferred embodiments of the invention, various modifications, alternate constructions and equivalents may be employed without departing from the true spirit and scope of the invention. For example, epitaxial layer 12 may be omitted if desired to provide an LED array capable of emitting radiation in the infrared region. Accordingly, the above description and illustration should not be construed as limiting the scope of the invention which is defined by the appended claims.

What is claimed is:

1. A non-coherent light-emitting diode array having improved radiation intensity and distribution characteristics, said array comprising:
   a semiconductor body having a top surface, a first zone of one conductivity type, and a second zone of opposite conductivity type contiguous with said first zone and forming a rectifying junction therebetween, said second zone having a varying thickness dimension extending from said rectifying junction to said top surface; and
   a dielectric surface layer adhered to said top surface, said dielectric surface layer having a plurality of apertures,
   said thickness dimension of said second zone being substantially greater in regions underlying said apertures than in regions underlying solid portions of said dielectric surface layer.

2. The combination of claim 1 wherein said apertures are arranged as a plurality of substantially parallel elongate openings.

3. The combination of claim 1 wherein the minimum value of said thickness dimension in said regions underlying said solid portions of said dielectric surface layer is about 1.5 microns.

4. The combination of claim 1 wherein said first zone and said second zone are N and P conductivity types, respectively.

5. The combination of claim 1 wherein said dielectric surface layer has a dielectric constant matched to the dielectric constant of said semiconductor body.

6. The combination of claim 5 wherein said dielectric surface layer is fabricated from $Si_3N_4$.

* * * * *